United States Patent
Okamoto et al.

(10) Patent No.: US 7,109,713 B2
(45) Date of Patent: Sep. 19, 2006

(54) RF COIL AND MAGNETIC RESONANCE IMAGING APPARATUS

(75) Inventors: Kazuya Okamoto, Saitama (JP); Yoshinori Hamamura, Otawara (JP); Yoshio Machida, Nasu-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/180,713

(22) Filed: Jul. 14, 2005

(65) Prior Publication Data

US 2005/0264292 A1     Dec. 1, 2005

Related U.S. Application Data

(62) Division of application No. 11/034,949, filed on Jan. 14, 2005, now Pat. No. 6,998,843, which is a division of application No. 10/234,242, filed on Sep. 5, 2002, now Pat. No. 6,930,481.

(30) Foreign Application Priority Data

Nov. 22, 2001   (JP)   .............................. 2001-358372

(51) Int. Cl.
   *G01V 3/00*       (2006.01)
   *A61B 5/055*      (2006.01)
(52) U.S. Cl. ...................... 324/318; 324/307; 324/309; 600/421; 600/422
(58) Field of Classification Search ..................... None
   See application file for complete search history.

(56) References Cited

U.S. PATENT DOCUMENTS

| | | | |
|---|---|---|---|
| 4,825,162 A | 4/1989 | Roemer et al. | 324/318 |
| 4,857,846 A | 8/1989 | Carlson | 324/309 |
| 4,857,847 A | 8/1989 | Machida | 324/311 |
| 5,208,534 A | 5/1993 | Okamoto et al. | 324/309 |
| 5,256,971 A | 10/1993 | Boskamp | 324/318 |
| 5,370,118 A | 12/1994 | Vij et al. | 600/422 |
| 5,389,880 A | 2/1995 | Mori | 324/318 |
| 5,594,337 A | 1/1997 | Boskamp | 324/318 |
| 5,621,323 A | 4/1997 | Larsen | 324/318 |
| 5,682,098 A | 10/1997 | Vij | 324/318 |
| 5,777,474 A | 7/1998 | Srinivasan | 324/318 |
| 6,097,186 A | 8/2000 | Nabetani | 324/319 |
| 6,137,291 A | 10/2000 | Szumowski et al. | 324/318 |
| 6,259,251 B1 | 7/2001 | Sugiura et al. | 324/318 |

(Continued)

FOREIGN PATENT DOCUMENTS

DE     195 05 062 A1    10/1996

(Continued)

OTHER PUBLICATIONS

Japanese Office Action dated Nov. 8, 2005 with translation.

(Continued)

*Primary Examiner*—Diego Gutierrez
*Assistant Examiner*—Tiffany A. Fetzner
(74) *Attorney, Agent, or Firm*—Nixon & Vanderhye P.C.

(57) ABSTRACT

A magnetic resonance imaging apparatus acquires magnetic resonance signals by the PI method using an RF coil unit having basic coils serving as surface coils which are arrayed with at least two coils along a static magnetic field direction (z direction) and at least two coils along each of two orthogonal x, y directions. The coils are divided into an upper unit and a lower unit. The upper unit and lower unit are fixed by a band or the like to allow them to be mounted on an object to be examined. The signals detected by the respective surface coils are sent to a data processing system through independent receiver units and formed into a magnetic resonance image.

27 Claims, 8 Drawing Sheets

U.S. PATENT DOCUMENTS

| | | | |
|---|---|---|---|
| 6,300,761 B1 | 10/2001 | Hagen et al. | 324/318 |
| 6,320,383 B1 | 11/2001 | Kato et al. | 324/318 |
| 6,323,648 B1 | 11/2001 | Belt et al. | 324/322 |
| 6,498,489 B1 | 12/2002 | Vij | 324/322 |
| 6,591,128 B1 | 7/2003 | Wu et al. | 600/422 |
| 6,639,406 B1 | 10/2003 | Boskamp et al. | 324/318 |
| 6,930,481 B1 * | 8/2005 | Okamoto et al. | 324/318 |
| 6,998,843 B1 * | 2/2006 | Okamoto et al. | 324/318 |
| 2002/0180442 A1 | 12/2002 | Vij | 324/322 |
| 2003/0132750 A1 * | 7/2003 | Machida | 324/322 |
| 2003/0210049 A1 | 11/2003 | Boskamp et al. | 324/311 |
| 2004/0061498 A1 | 4/2004 | Ochi et al. | 324/318 |
| 2004/0183534 A1 | 9/2004 | Chan et al. | 324/318 |
| 2005/0122113 A1 * | 6/2005 | Okamoto et al. | 324/318 |
| 2005/0264292 A1 * | 12/2005 | Okamoto et al. | 324/318 |

FOREIGN PATENT DOCUMENTS

| | | |
|---|---|---|
| JP | 6-14901 | 1/1994 |
| JP | 10-66683 | 3/1998 |
| JP | 2000-166896 | 6/2000 |
| JP | 2000-254109 | 9/2000 |

OTHER PUBLICATIONS

Okamoto et al., "Torso Array Coil with Eight QD-Surface Coils for Parallel Imaging", Proc. Intl. Soc. Mag. Resonance, Med. 10 (2002).

* cited by examiner

RF COIL AND MAGNETIC RESONANCE IMAGING APPARATUS

CROSS-REFERENCE TO RELATED APPLICATIONS

This application is a division of our commonly assigned application 11/034,949 filed Jan. 14, 2005 (published as U.S. Patent Publication 2005/0122113 A1 on Jun. 9, 2005, now issued as U.S. Pat. No. 6,998,843) which is, in turn, a division of our commonly assigned application 10/234,242 filed Sep. 5, 2002 which was published as U.S. Patent Application Publication 2003/0094948 A1 on May 22, 2003 and issued as U.S. Pat. No. 6,930,481 B2 on Aug. 16, 2005, the entire content of which is hereby incorporated by reference. This application is also based upon and claims the benefit of priority from the prior Japanese Patent Application No. 2001-358372, filed Nov. 22, 2001, the entire contents of which are incorporated herein by reference.

BACKGROUND OF THE INVENTION

1. Field of the Invention

The present invention relates to a signal detection RF coil which generates a magnetic resonance signal by applying RF pulses to an object to be examined in a static magnetic field and at the same time, acquires a magnetic resonance signal, and a magnetic resonance imaging apparatus which using the RF coil.

2. Description of the Related Art

A magnetic resonance imaging (MRI) apparatus is an apparatus which images the chemical and physical microscopic information of a substance by using a phenomenon in which when a group of nuclei having a unique magnetic moment is placed in a uniform static magnetic field, they resonantly absorb energy of an RF magnetic field that rotates at a specific frequency. Among recent techniques associated with such a magnetic resonance imaging apparatus, a phased array technique is available, in which a plurality of surface coils are arranged with respect to a region of interest, and an image with a high S/N ratio is acquired by receiving a magnetic resonance signal.

For example, a magnetic resonance imaging apparatus is disclosed in Jpn. Pat. Appln. KOKAI Publication No. 4-42937, in which a plurality of surface coils (e.g., looped coils) are arranged in a desired region of an object to be examined which is to be imaged, and magnetic resonance signals from the object are detected through these surface coils, respectively. The detected magnetic resonance signals are converted into a plurality of series of image data by imaging processing. Data corresponding to the same spatial position are multiplied by predetermined weighting functions (function determined in advance on the basis of the distribution of RF magnetic fields generated by the respective surface coils), and the resultant data are added together. The respective pixel data obtained in this manner are combined to provide an image with a high S/N ratio of an overall desired region of the object.

A parallel imaging method (to be referred to as a "PI method" hereinafter) which is a high-speed imaging method using multiple surface coils is proposed in Magnetic Resonance in Medicine, Vol. 29, pp. 681 to 688 (1993) or Magnetic Resonance in Medicine, Vol. 30, pp. 142 to 145 (1993). The contents of the former are also disclosed in "Rapid MRI using multiple receivers producing multiple phase-encoded data derived from a single NMR response" (U.S. Pat. No. 4,857,846). The phased array technique is also introduced as a noteworthy technique in Magnetic Resonance in Medicine, Vol. 42, pp. 952–962 (1999). According to the techniques disclosed in these references, when a plurality of surface coils are arranged around a region of interest, the data amount of raw MRI data in the encoding direction can be reduced by almost the reciprocal of the number of coils arrayed in the direction. Assume that a 256×256 matrix axial image is to be acquired. In this case, if the X and Y directions correspond to the reading and encoding directions, respectively, 256 data are generally sampled while a gradient field is applied in the X direction. This operation is repeated 256 times while the gradient filed pulse intensity in the Y direction is changed in predetermined steps, thereby obtaining 256×256 raw data. By performing a Fourier transform of the raw data, an axial image can be obtained. Assume that two surface coils are so arranged as to sandwich the patient in the vertical direction, and the PI method is used. In this case, even if the number of times data acquisition is done while the gradient field pulse intensity in the Y direction is changed in predetermined steps, a 256×256 matrix image can be reproduced properly.

In this manner, a data acquisition time T is reduced to 1/n, and the S/N ratio is reduced to $1/n^{1/2}$. By acquiring data using a plurality of surface coils with a high S/N ratio, a decrease in S/N ration due to a decrease in data acquisition time can be compensated for. In addition, if surface coils are arrayed in the X direction or Z direction (static magnetic field direction), the number of times of encoding can be decreased in accordance with the number of coils arrayed in encoding in the X or Z direction. This makes it possible to shorten the data acquisition time. That is, high-speed imaging can be done.

However, conventional magnetic resonance imaging apparatuses are not designed to arrange RF coils in the three directions, i.e., the X, Y, and Z directions, but are designed to arrange RF coils in the two directions, i.e., the X and Y directions or the Y and Z directions. When, therefore, an abdominal region is to be imaged by using the PI method, the number of times of encoding in the Z or X direction cannot be decreased. Furthermore, when a slice in an arbitrary direction (oblique imaging) is selected, the PI method is difficult to apply.

BRIEF SUMMARY OF THE INVENTION

The present invention has been made in consideration of the above situation, and has as its object to provide a magnetic resonance imaging apparatus which can freely apply the PI method to a slice in an arbitrary direction in the imaging method using a plurality of surface coils, thereby obtaining a magnetic resonance image with a high S/N ratio or at high speed, and an RF coil used in the apparatus.

The present invention may provide an RF coil used in a magnetic resonance imaging apparatus which receives magnetic resonance signals generated from an object to be examined which is placed in a static magnetic field and generates a magnetic resonance image, the RF coil comprising: a plurality of surface coils which are arrayed at least in twos in a direction of the static magnetic field and two directions perpendicular thereto and receive the magnetic resonance signals.

The present invention may provide an RF coil used in a magnetic resonance imaging apparatus which receives magnetic resonance signals generated from an object to be examined which is placed in a static magnetic field and generates a magnetic resonance image, the RF coil comprising: a plurality of surface coils which are arrayed at least in twos in a direction of the static magnetic field and two directions perpendicular thereto and receive the magnetic resonance signals; and a plurality of cable which electrically connect the surface coils which oppose each other or are adjacent to each other to a ground side to make at least one of the surface coils which oppose each other or are adjacent to each other acquire magnetic resonance signals having substantially the same phase.

The present invention may provide a magnetic resonance imaging apparatus which receives magnetic resonance signals generated from an object to be examined which is placed in a static magnetic field and generates a magnetic resonance image, the magnetic resonance imaging apparatus comprising: an RF coil having a plurality of surface coils which are arrayed at least in twos in a direction of the static magnetic field and two directions perpendicular thereto and receive the magnetic resonance signals; a receiver which is placed for each of the surface coils independently and receives each magnetic resonance signal from the RF coil; and an image generating unit configured to generate a magnetic resonance image on the basis of the magnetic resonance signals received by the receiver.

The present invention may provide a magnetic resonance imaging apparatus which receives magnetic resonance signals generated from an object to be examined which is placed in a static magnetic field and generates a magnetic resonance image, the magnetic resonance imaging apparatus comprising: an RF coil having a plurality of surface coils which are arrayed at least in twos in a direction of the static magnetic field and two directions perpendicular thereto and receive the magnetic resonance signals; a plurality of cable which electrically connect the surface coils which oppose each other or are adjacent to each other to a ground side to make at least one of the surface coils which oppose each other or are adjacent to each other acquire magnetic resonance signals having substantially the same phase; a receiver which is placed for each of the surface coils independently and receives each magnetic resonance signal from the RF coil; and an image generating unit configured to generate a magnetic resonance image on the basis of the magnetic resonance signals received by the receiver.

BRIEF DESCRIPTION OF THE SEVERAL VIEWS OF THE DRAWING

FIG. 2 is a view showing an receiving RF coil 14*b* constituted by upper and lower units 140 and 141 and used for the diagnosis of an abdominal region or the like;

DETAILED DESCRIPTION OF THE INVENTION

An embodiment of the present invention will be described below with reference to the views of the accompanying drawing. Note that the same reference numerals denote constituent elements having substantially the same functions and arrangements, and a repetitive description will be made only when required.

Figure 1:
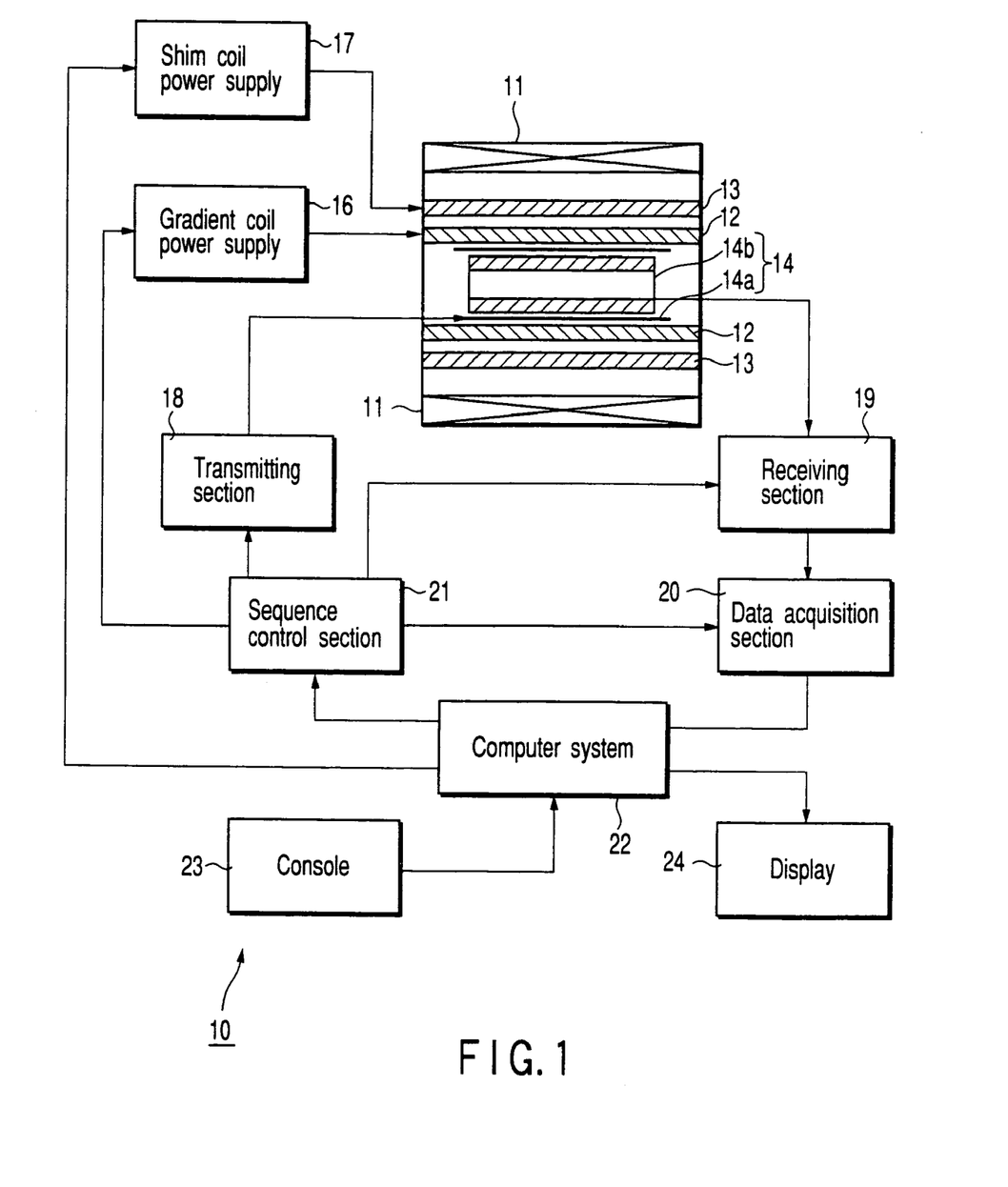
FIG. 1 is a block diagram showing the arrangement of a magnetic resonance imaging apparatus according to an embodiment.

FIG. 1 is a block diagram showing the arrangement of a magnetic resonance imaging apparatus according to this embodiment. Referring to FIG. 1, a magnetic resonance imaging apparatus 10 includes a static magnetic field magnet 11, gradient coil 12, shim coil 13, RF coil 14, gradient coil power supply 16, shim coil power supply 17, transmitting section 18, receiving section 19, data acquisition section 20, sequence control section 21, computer system 22, console 23, and display 24.

The static magnetic field magnet 11 is a magnet for generating a static magnetic field. This magnet generates a uniform static magnetic field. As the static magnetic field magnet 11, a permanent magnet, superconductive magnet, or the like is used.

The gradient coil 12 is placed inside the static magnetic field magnet 11 and converts the pulse current supplied from the gradient coil power supply 16 into a gradient field. A signal generating region (position) is specified by the gradient field generated by the gradient coil 12.

The shim coil 13 is placed inside the static magnetic field magnet 11 and serves to improve the homogeneity of a magnetic field. The shim coil 13 is driven by the shim coil power supply 17.

The shim coil 13 and gradient coil 12 apply a uniform static magnetic field to an object to be examined (not shown) and gradient fields having linear gradient field distributions in three directions, i.e., X, Y, and Z directions, which are perpendicular to each other. Assume that the Z-axis direction coincides with the static magnetic field direction in this embodiment.

An RF coil unit is comprised of a transmitting RF coil unit 14*a* for applying RF pulses to an imaging region of the object to generate a magnetic resonance signal and the receiving RF coil unit 14b which is placed near the object, more preferably placed to sandwich the object in tight contact and receives a magnetic resonance signal from the object. The receiving RF coil unit 14b generally has a shape specialized for each region.

The receiving RF coil unit 14b has a plurality of surface coils arrayed in the X, Y, and Z directions which are perpendicular to each other. These surface coils have been treated to prevent magnetic coupling. The contents of this will be described in detail later.

The transmitting section 18 has an oscillating section, phase selecting section, frequency conversion section, amplitude modulating section, and RF power amplifying section (none of which are shown), and transmits RF pulses corresponding to a Larmor frequency to the transmitting RF coil 14a. The magnetization of a predetermined nucleus of the object is excited by the RF pulses generated from the transmitting RF coil 14a upon this transmission.

The receiving section 19 has an amplifying section, intermediate frequency converting section, phase detecting section, filter, and A/D converter (none of which are shown). The receiving section 19 performs amplification processing, intermediate frequency conversion processing using an oscillation frequency, phase detection processing, filter processing, and A/D conversion processing for the magnetic resonance signal (RF signal) which is emitted when the magnetization of the nucleus relaxes from the excited state to the ground state and received from the receiving RF coil 14b.

The data acquisition section 20 acquires the digital signals sampled by the receiving section 19.

The sequence control section 21 controls the operations of the gradient coil power supply 16, shim coil power supply 17, transmitting section 18, receiving section 19, and data acquisition section 20.

The computer system 22 controls the sequence control section 21 on the basis of the commands input from the console 23. The computer system 22 executes post-processing, i.e., reconstruction such as a Fourier transform, for the magnetic resonance signal input from the data acquisition section 20 to obtain the spectrum data or image data of a desired nuclear spin inside the object.

The console 23 has an input unit (e.g., a mouse, trackball, mode switch, and keyboard) for inputting various commands, instructions, and information from the operator.

The display 24 is an output means for displaying the spectrum data, image data, or the like input from the computer system 22.

(RF Coil)

The arrangement of the RF coil will be described in detail next.

Figure 2:
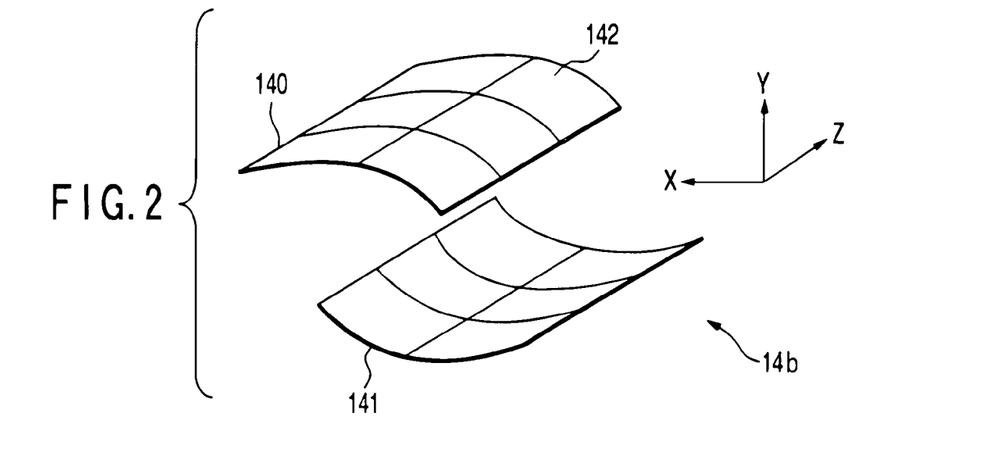

FIG. 2 shows the receiving RF coil unit 14b which is constituted by an upper sub-unit 140 and lower sub-unit 141 and used to diagnose, for example, the abdomen. As shown in FIG. 2, each of the upper and lower sub-units 140 and 141 has 2 (X direction) X3 (Z direction)=6 basic coils 142. The upper and lower sub-units 140 and 141 are arranged to oppose each other along the Y direction. The receiving RF coil unit 14b therefore has the two basic coils 142 (in each sub-unit 140, 141) as surface coils in the X direction, three basic coils 142 as surface coils in the Z direction, and pairs of opposed basic coils distributed over the upper and lower units 140 and 141 as surface coils in the Y direction. The receiving RF coil unit 14b therefore has a total of 12 surface coils arranged in the above manner. When the PI method is executed by using this RF coil, the number of data acquisitions used for encoding of gradient field pulses typically can be reduced to ½ in the X direction, ½ in the Y direction, and ⅓ in the Z direction.

Figure 3:
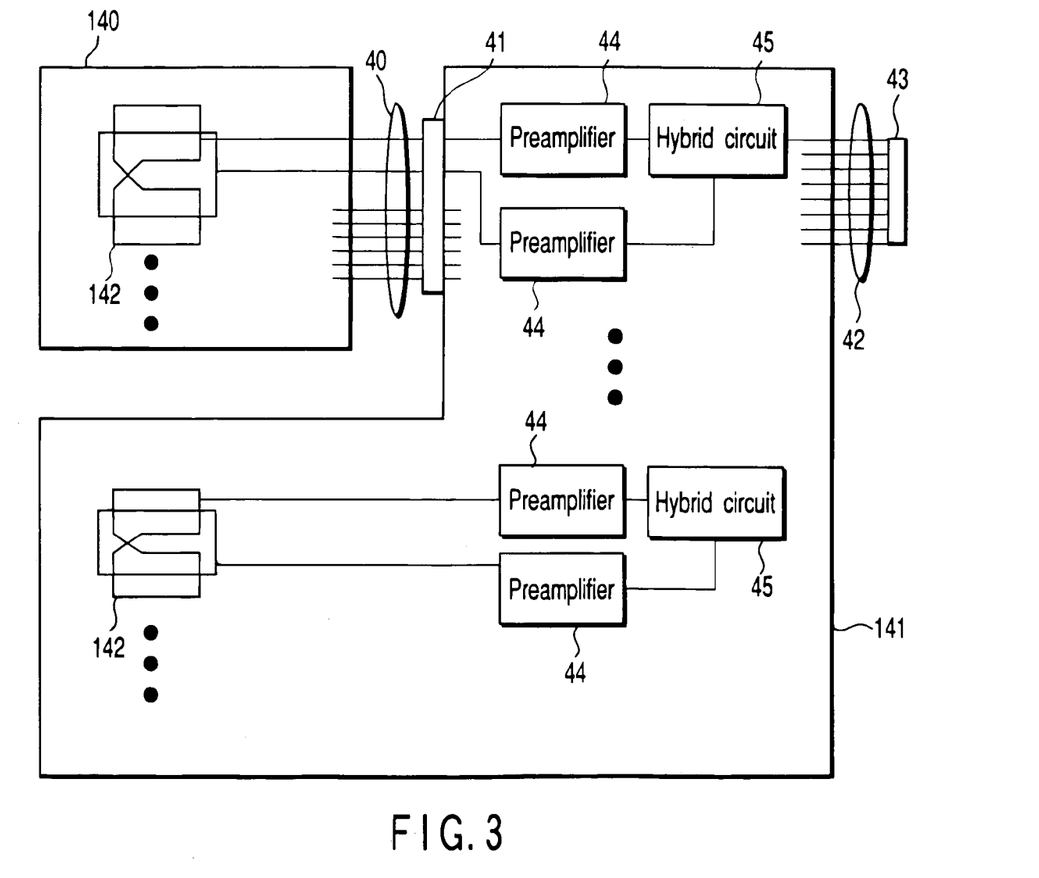
FIG. 3 is a block diagram of the receiving RF coil 14*b*.
Figure 4:
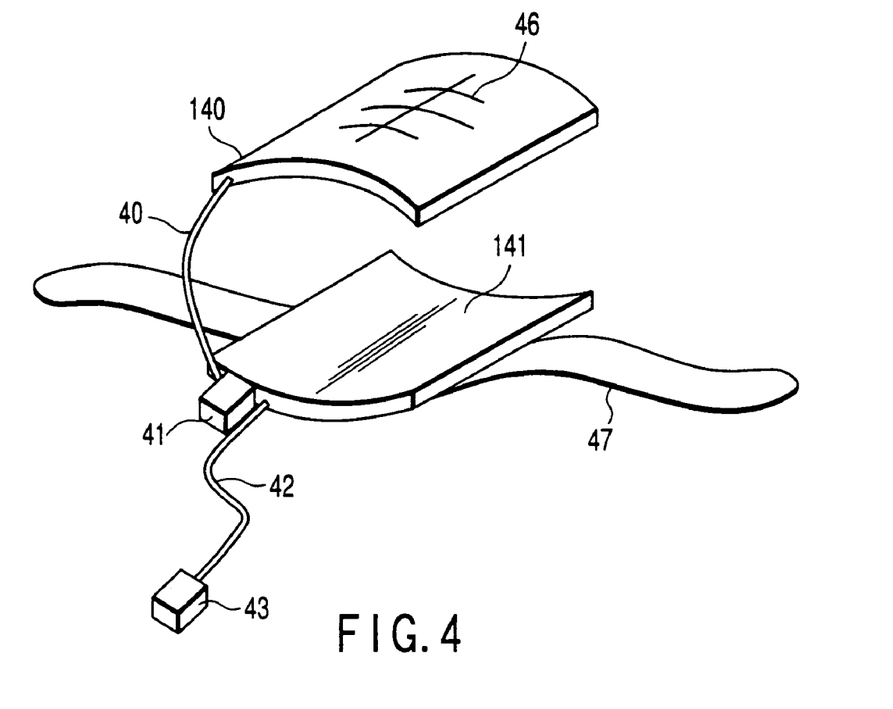
FIG. 4 is a perspective view showing an example of the receiving RF coil 14*b* which is constituted by the upper and lower units 140 and 141 and fixed to an object to be examined when it is used.

FIG. 3 is a block diagram of the receiving RF coil unit 14b. As shown in FIGS. 3 and 4, the upper and lower sub-units 140 and 141 are coupled to each other through a first cable 40 and first connector 41. The magnetic resonance signals detected by the surface coils of the upper unit 140 are temporarily received by the lower unit 141 through the cable 40 having the connector 41 and loaded altogether into a signal processing system (incorporated in the main body of the magnetic resonance imaging apparatus 10) through a cable 42 and connector 43.

As described above, each of the upper and lower sub-units 140 and 141 has a plurality of six basic coils 142 arranged in each of the X and Z directions. FIG. 3 shows each basic coil 142 constituted by a circular coil element and 8-shaped coil element. This basic coil 142 will be described in detail later. The lower sub-unit 141 has preamplifiers 44 and hybrid circuits 45. The preamplifiers 44 are connected to the respective coils to amplify signals. The hybrid circuit 45 changes the phase of a signal from one of the circular and 8-shaped coil elements constituting the basic coil 142 and combines the resultant signal with a signal from the other coil element. Note that the preamplifiers 44 and hybrid circuits 45 may be arranged in the magnetic resonance imaging apparatus 10.

Figure 5:
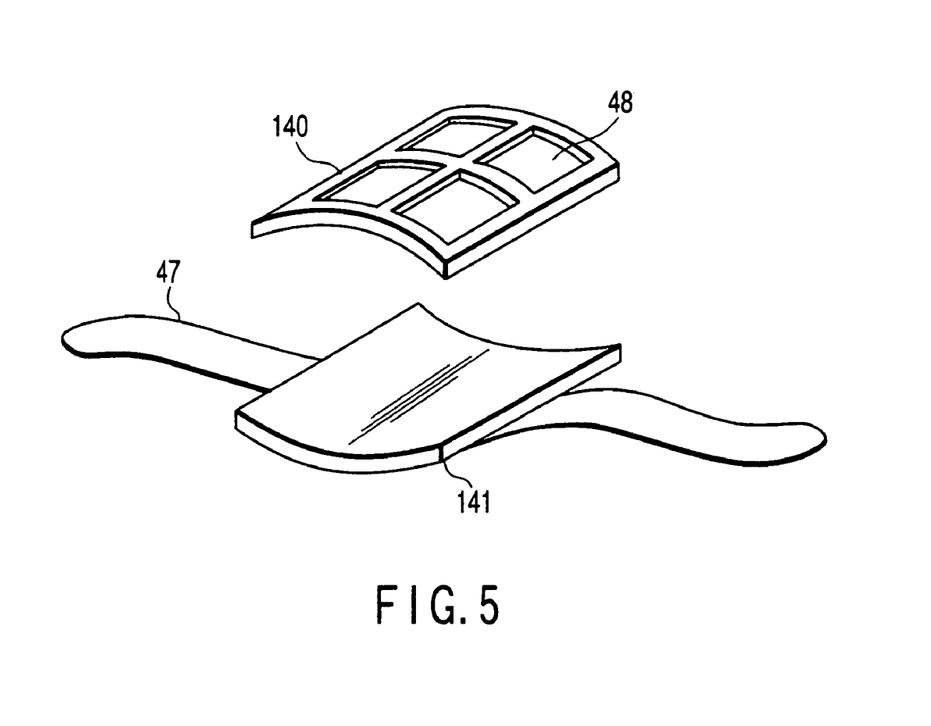
FIG. 5 is a perspective view showing another example of the receiving RF coil 14*b* which is constituted by the upper and lower units 140 and 141 and fixed to an object to be examined when it is used.

In actual imaging, an object to be examined is placed on the lower sub-unit 141, and the upper sub-unit 140 is placed on the object so as to oppose the lower sub-unit 141 (see FIGS. 4 and 5). This receiving RF coil unit 14b is designed to minimize the number of components included in the upper sub-unit 140 by connecting the upper sub-unit 140 and lower sub-unit 141 through connectors. The upper sub-unit 140 is sufficiently reduced in weight, and hence the load on the object can be reduced.

The receiving RF coil unit 14b constituted by the upper and lower sub-units 140 and 141 in FIGS. 2 and 3 is generally fixed to the object when it is used. This usage of the coil unit will be described with reference to FIGS. 4 and 5.

FIGS. 4 and 5 show an example of the receiving RF coil unit 14b constituted by the upper and lower sub-units 140 and 141 and fixed to the object when it is used. The receiving RF unit coil 14b constituted by the upper and lower sub-units 140 and 141 shown in FIGS. 4 and 5 is suitable for imaging a thoracicoabdominal region, in particular. Fro example, this receiving RF coil unit 14b is used in magnetic resonance imaging in the following manner. Referring to FIG. 4, the object is laid down on the lower sub-unit 141, and the upper sub-unit 140 is placed on the object. The lower sub-unit 141 is mounted on a bed (not shown). The upper unit 140 is fixed to the lower sub-unit 141 with a band 47.

It is preferable that the upper and lower sub-units 140 and 141 be arranged to maintain a predetermined positional relationship, and oppose to each other along the Y direction, in particular. For this purpose, this receiving RF coil unit 14b has a mark 46 to be used as a reference for the positioning of the upper and lower sub-units 140 and 141. The operator places the upper sub-unit 140 such that the mark on the upper sub-unit 140 opposes the lower sub-unit 141. This facilitates alignment of the receiving RF coil unit 14b. As shown in FIG. 5, in place of the mark 46, grooves 48 may be formed in the upper sub-unit 140 to allow positioning of the upper and lower sub-units when they are fixed with the band 47.

Alternatively, the receiving RF coil unit 14*b* may have a form to allow the upper sub-unit 140 to be place don the object by utilizing a predetermined shape.

Figure 6:
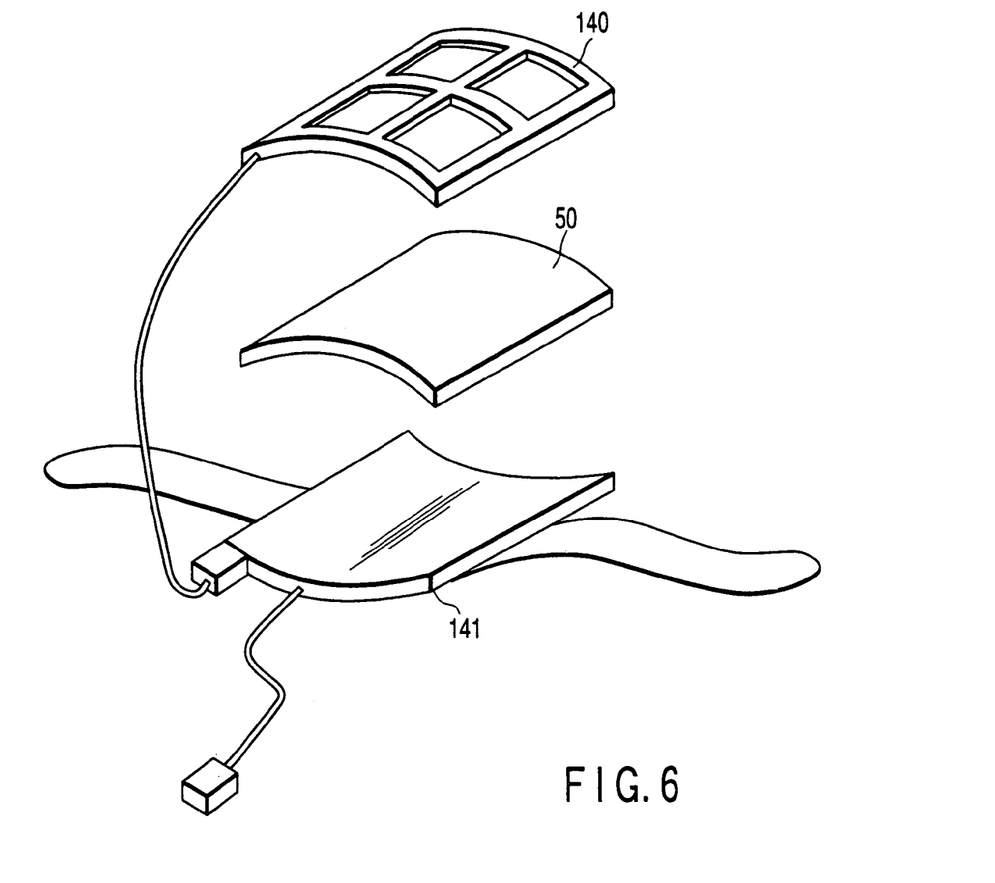
FIG. 6 is a perspective view for explaining an embodiment of the receiving RF coil 14*b* having a form 50.

FIG. 6 is a perspective view for explaining an embodiment of the receiving RF coil unit 14*b* having a form 50. As shown in FIG. 6, when the upper sub-unit 140 is placed on the object above and in registered opposition to the lower sub-unit 141, the form 50 is placed between the upper sub-unit 140 and the object. This form 50 serves to stabilize the shape of the upper sub-unit 140.

In general, in the P1 method, a pre-scan is executed to obtain an RF magnetic field on each surface coil before the acquisition of main data. The position of the receiving RF coil unit 14*b* in this pre-scan preferably coincides with the position of the receiving RF coil unit 14*b* in acquisition of main data. According to the above receiving RF coil unit 14*b*, the presence of the form 50 can stabilize the shape and prevent a change in coil position, thus realizing excellent main data acquisition.

(Electromagnetic Coupling Preventing Function)

The function of preventing the effect of electromagnetic coupling of the receiving RF coil 14*b*, which this magnetic resonance imaging apparatus 10 has, will be described next. This function is realized by one of the two techniques described next or a combination thereof.

The first technique of preventing electromagnetic coupling of the receiving RF coil 14*b* is a technique which is to be applied to a case wherein the basic coil 142 is a QD coil and devises the arrangement of two coils constituting the QD coil.

Figure 7:
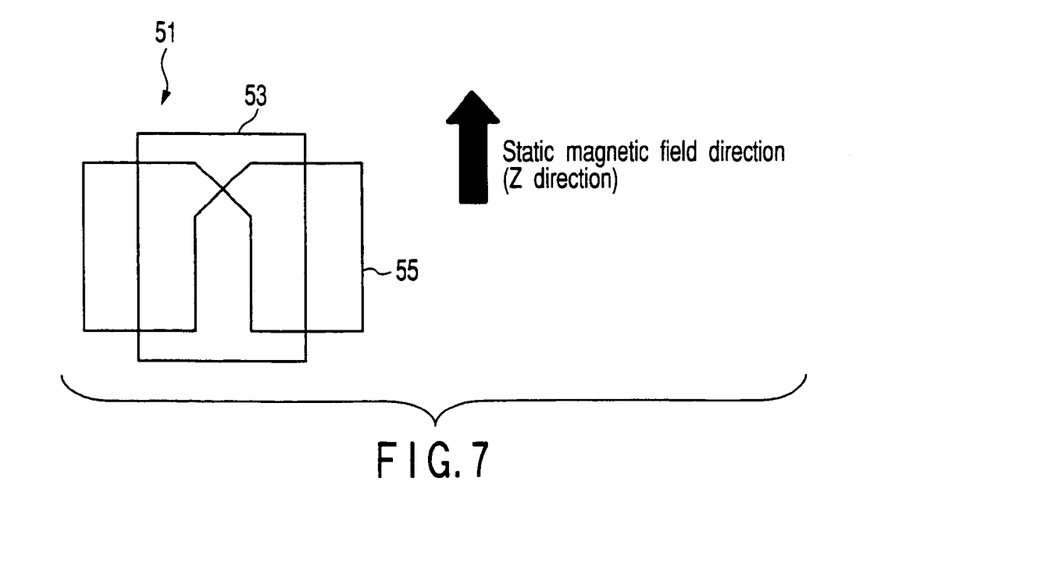
FIG. 7 is a view showing a surface QD coil constituted by a looped coil 53 and 8-shaped coil 55.

FIG. 7 shows a first surface QD coil 51 serving a s the basic coil 142, which is constitute by a looped coil element 53 and 8-shaped coil element 55. As shown in FIG. 7, this first surface QD coil 51 has the looped coil element 53 placed in the center of the 8-shaped coil element 55. This arrangement can suppress electric coupling between the looped coil element 53 and the 8-shaped coil element 55. The first surface QD coil 51 is especially suitable for a case wherein a static magnetic field direction is a lateral direction (Z direction) with respect to the shape of "8" of the 8-shaped coil element 55 (i.e., the body axis direction of the lying object coincides with the static magnetic field direction).

Figure 8:
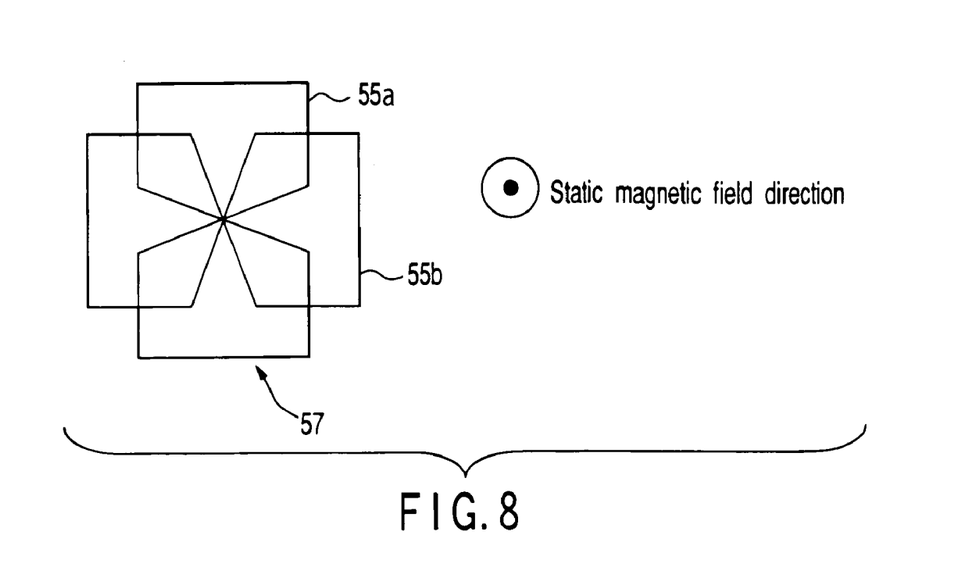
FIG. 8 is a view showing a second surface QD coil 57 serving as a basic coil 142 which is constituted by 8-shaped coils 55*a* and 55*b*.

FIG. 8 shows a second surface QD coil 57 serving as the basic coil 142, which is constituted by 8-shaped coil elements 55*a* and 55*b*. As shown in FIG. 8, in the second surface QD coil 57, the 8-shaped coil elements 55*a* and 55*b* are so overlapped as to be perpendicular to each other. With this arrangement, similar to the first surface QD coil 51, electric coupling between the 8-shaped coil elements 55*a* and 55*b* can be suppressed. This second surface QD coil 57 is suitable for a case wherein a static magnetic field direction is perpendicular to the plane formed by the 8-shaped coil elements (i.e., the static magnetic field direction coincides with the Y direction).

Note that in this receiving RF coil 14*b*, for example, the first or second surface QD coils are arrayed as the basic coils 142 in the X or Z direction. When a plurality of surface coils adjusted to the same resonance frequency in this manner are arrayed to simultaneously acquire data, electric coupling between the coils is suppressed by one of the following two methods or a combination thereof. One method is a method of suppressing coupling by adjusting a spatial arrangement. The other method is a method of suppressing coupling by using preamplifiers having a low input impedance as preamplifiers which are coupled to the coils to amplify signals, as disclosed in Jpn. Pat. Appln. KOKOKU Publication No. 4-42937.

Figure 9:
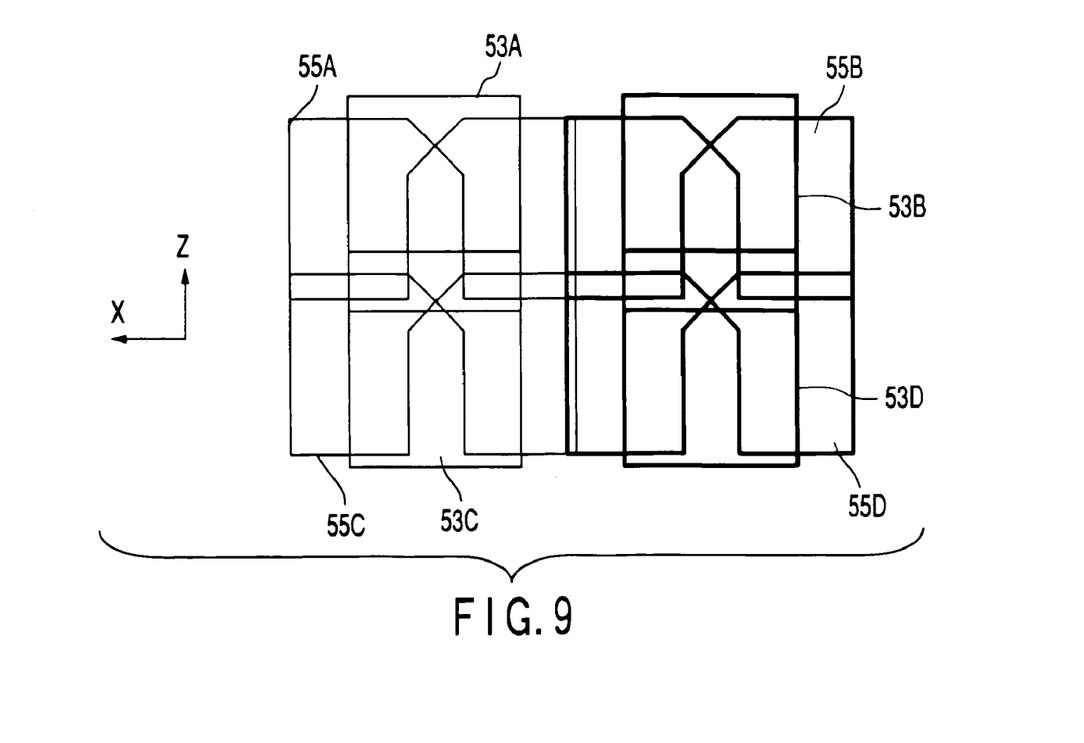
FIG. 9 is a view showing an example of how a method of suppressing coupling is applied to this receiving RF coil 14*b*.

FIG. 9 shows an example of how the method of suppressing coupling by adjusting a spatial arrangement is applied to this receiving RF coil 14*b*. In the case shown in FIG. 9, the spatial arrangement in which the first surface QD coils 51 shown in FIG. 7 are arrayed in twos two-dimensionally (X-Z plane) is adjusted to suppress coupling between the coils. More specifically, when 8-shaped coils 55A, 55B, 55C, and 55D are adjacent to each other in the X or Z direction, the adjacent coils are partly overlapped to suppress electric coupling. In addition, looped coils 53A and 53C and looped coils 53B and 53D are partly overlapped to suppress electric coupling.

Referring to FIG. 9, coupling between the diagonally opposite 8-shaped coils, the looped coils arrayed in the X direction, the diagonally opposite looped coils, and the looped coils which are adjacent and opposite to the 8-shaped coils cannot be sufficiently suppressed by adjusting the spatial arrangement. Even if decoupling can be theoretically done by overlapping coils, a manufacture error may be caused. As a consequence, coupling may be left unsuppressed. In such a case, sufficient coupling suppression can be attained by also using the above method of suppressing coupling by using amplifiers with low input impedance.

The second technique of preventing the effect of electromagnetic coupling of the RF coil 14 will be described next. In the technique, for example, the positional relationship or connection to the output cable of the upper unit 140 and the lower unit 141 is devised to prevent a deterioration in sensitivity in a region of interest when some electromagnetic coupling remain. This technique is sufficiently effective by itself. If, however, the technique is combined with the first technique, a deterioration in sensitivity in the center of the object can be prevented even in the presence of residual coupling.

In general, when coils couple to each other, two types of modes are produced, i.e., a mode in which RF currents flow in directions to cancel out generated RF magnetic fields produced by the respective coils and a mode in which RF currents flow to generate RF magnetic fields in the same direction so as to enhance the magnetic fields. In the former case, since the RF magnetic fields generated by the coils cancel each other, the sensitivity in the center of the object sandwiched by the coils deteriorates. In the latter case, the RF magnetic fields do not cancel each other, and hence no deterioration in sensitivity occurs.

Even if residual coupling remain, a deterioration in the sensitivity in a region of interest can be prevented by devising the wiring of signal cables or the arrangement of coils so as to allow selection of the latter mode. The magnetic resonance imaging apparatus 10 selects the latter mode by devising the positional relationship or wiring between the upper and lower units 140 and 141.

Figure 10:
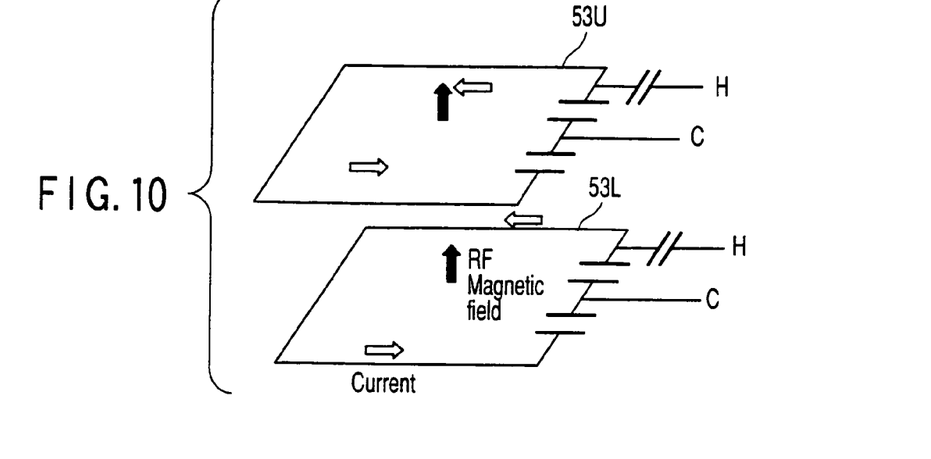
FIG. 10 is a view showing a wiring method used for a looped coil 53U of the upper unit 140 and a looped coil 53L of the lower unit 141 to prevent a deterioration in sensitivity in a region of interest.

FIG. 10 shows a wiring method to be applied to a looped coil 53U of the upper unit 140 and a looped coil 53L of the lower unit 141 to prevent a deterioration in sensitivity in a region of interest. Referring to FIG. 10, a portion of a signal cable which is connected to the ground side is referred to as a C side (cold side), and a portion which is not connected to the ground side is referred to as an H side (hot side). In this case, the arrangements of the H and C sides coincide between the looped coil 53U and the looped coil 53L, detected signals have the same phase. Therefore, RF currents flow in the same direction, and RF magnetic fields are generated in the same direction, thereby preventing a deterioration in sensitivity due to coupling.

Figure 11:
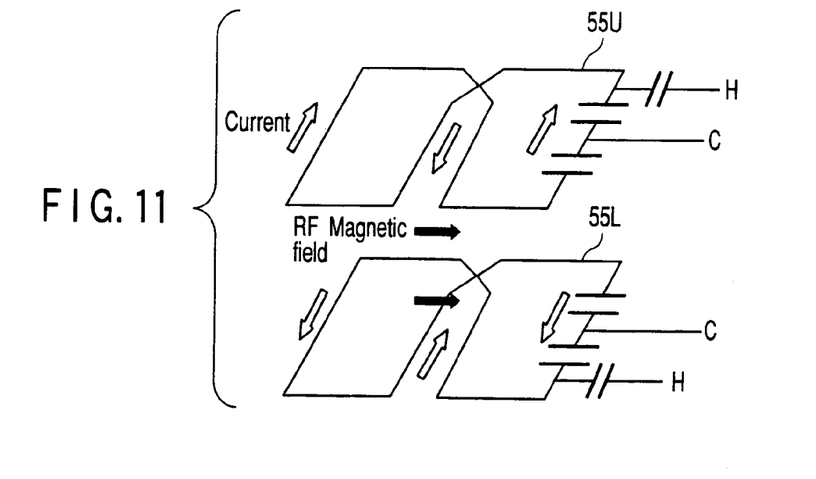
FIG. 11 is a view showing a wiring method used for an 8-shaped coil 55U of the upper unit 140 and an 8-shaped coil 55L of the lower unit 141 to prevent a deterioration in sensitivity in a region of interest.

FIG. 11 shows wiring done for an 8-shaped coil 55U of the upper unit 140 and an 8-shaped coil 55L of the lower unit 141. As shown in FIG. 11, the arrangement of the H and C sides of the upper coil may be reversed with respect to those of the lower coil to match the directions of the RF magnetic fields generated by the 8-shaped coils.

The effects obtained by the above RF coil and magnetic resonance imaging apparatus will be described next.

This magnetic resonance imaging apparatus has a plurality of surface coils arrayed in the X, Y, and Z directions which are perpendicular to each other. In the imaging method using the PI method, therefore, an imaging time T can be greatly shortened. In addition, owing to the high sensitivity characteristics of the surface coils, a decrease in S/N ratio with the shortening of the imaging time T can be compensated for. This makes it possible to acquire high-precision magnetic resonance images. This increase in S/N ratio will be described in detail below with consideration given to the arrangement of the RF coil in the Z direction.

Figure 12:
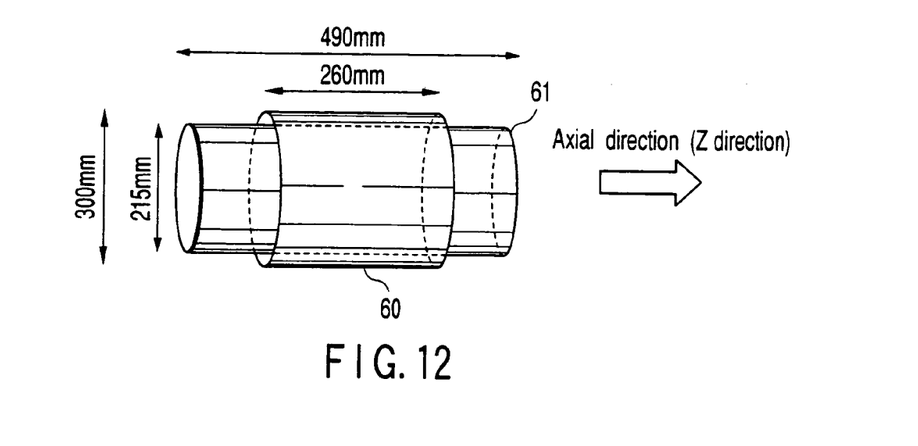
FIG. 12 is a view for explaining the effect of this magnetic resonance imaging apparatus.

The magnetic resonance imaging apparatus 10 has the receiving RF coil 14b having a plurality of basic coils 142 arrayed in the Z direction. In contrast to this, a conventional RF coil has only integral-type coil in the Z direction. An increase in S/N ratio owing to the difference between the arrangements in the Z direction can be checked in the following manner. For example, the sensitivity (S/N ratio) on the central body axis in a case wherein a phantom 61 is imaged by an integral-type long-axis volume coil 60 as shown in FIG. 12 is compared with that in a case wherein the phantom 61 is imaged by two short-axis volume coils 63 and 64 arrayed in the Z direction as shown in FIG. 13 by computer simulation.

Figure 14:
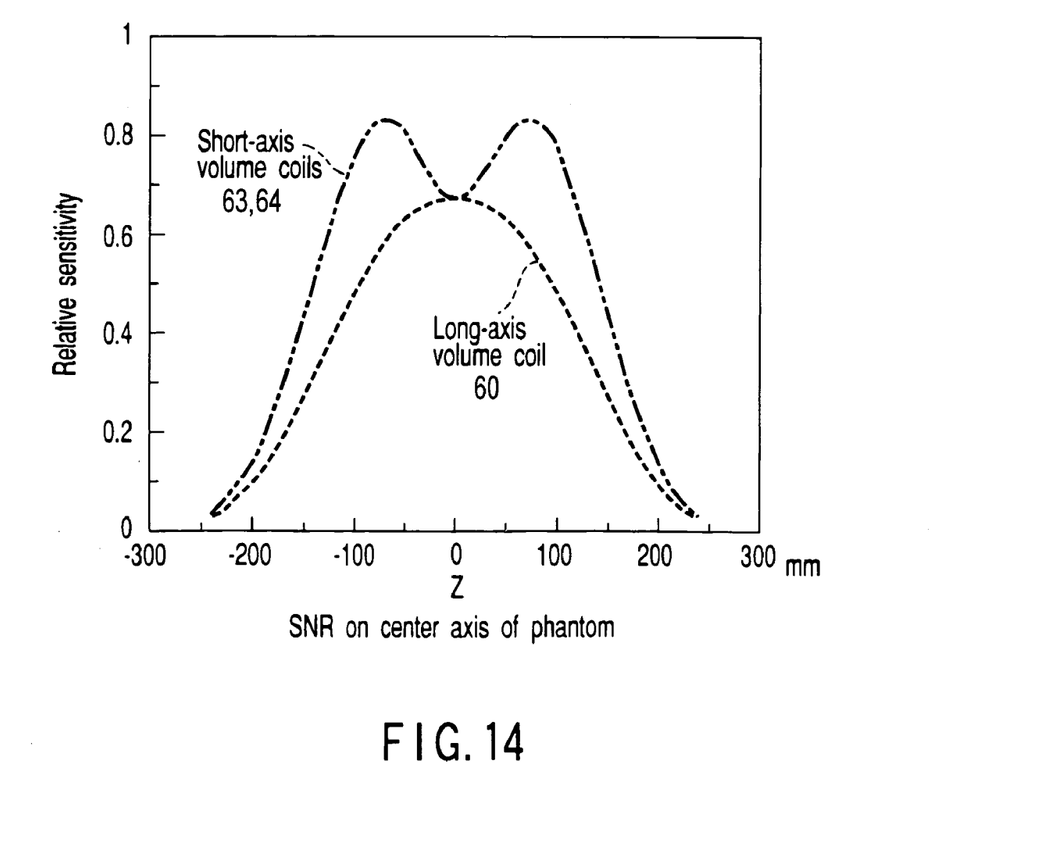
FIG. 14 is a graph showing the result of the above computer simulation.

FIG. 14 is a graph showing the above computer simulation result. As shown in FIG. 14, the short-axis volume coils 63 and 64 are higher in sensitivity than the long-axis volume coil 60.

Figure 13:
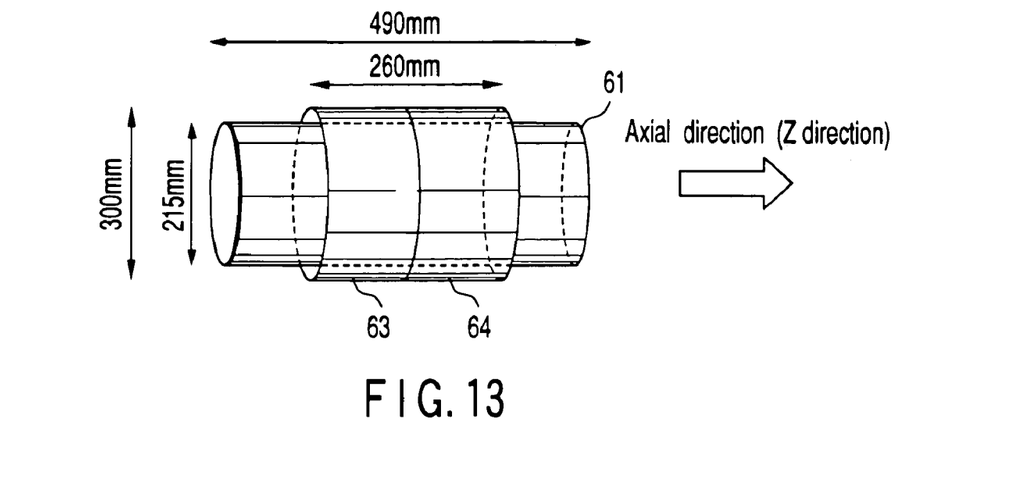
FIG. 13 is a view for explaining the effect of this magnetic resonance imaging apparatus.

The model shown in FIG. 13 using the short-axis volume coils 63 and 64 is equivalent to this magnetic resonance imaging apparatus having a plurality of surface coils arrayed in the Z direction. The model shown in FIG. 12 using the long-axis volume coil is equivalent to the conventional magnetic resonance imaging apparatus in which a plurality of surface coils are not arrayed in the Z direction (i.e., the apparatus using a long integral-type coil in the Z direction). Therefore, this apparatus can acquire signals with higher S/N ratios than the conventional apparatus.

In addition, the RF coil 14 has a band for fixing the coil to the object and a reference for positioning. Each QD coil serving as each surface coil exhibits the maximum S/N ratio characteristic. By devising a wiring method, a deterioration in sensitivity in a central region is prevented even with residual coupling. Each arrangement described above can realize a high S/N ratio.

The present invention has been described on the basis of the embodiment. However, those who skilled in the art can make various modifications and corrections of the embodiment within the spirit and scope of the invention, and hence it should be understood that such modifications and corrections fall within the range of the present invention. For example, the embodiment can be variously modified within the spirit and scope of the invention as follows.

Figure 15:
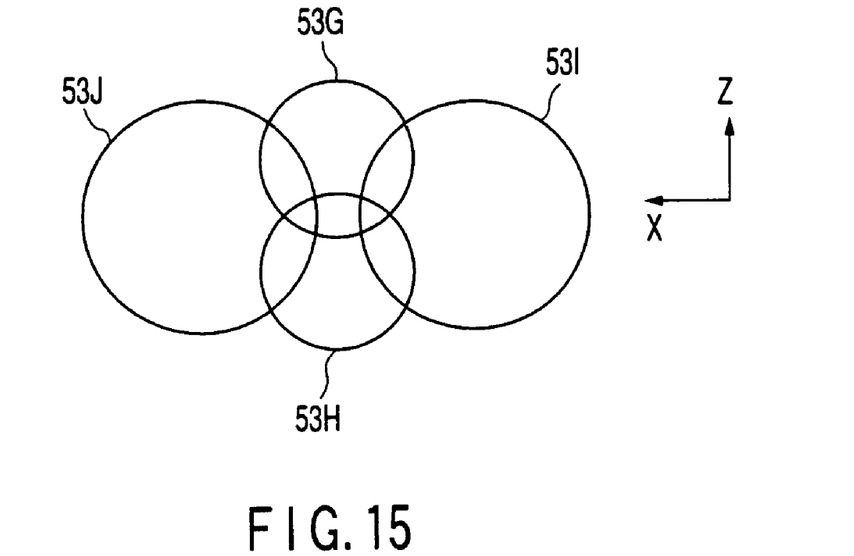
FIG. 15 is a view showing an example of the upper unit 140 used for chest imaging.

The receiving RF coil 14b takes different shapes depending on the regions to be imaged. FIG. 15 shows an example of the upper unit 140 suitable for chest imaging. As shown in FIG. 15, the upper unit 140 has looped coils 53G, 53H, 53I, and 53J serving as surface coils arrayed in the X and Z directions. In addition, the adjacent looped coils are partly overlapped to reduce coupling between the coils.

Figure 16:
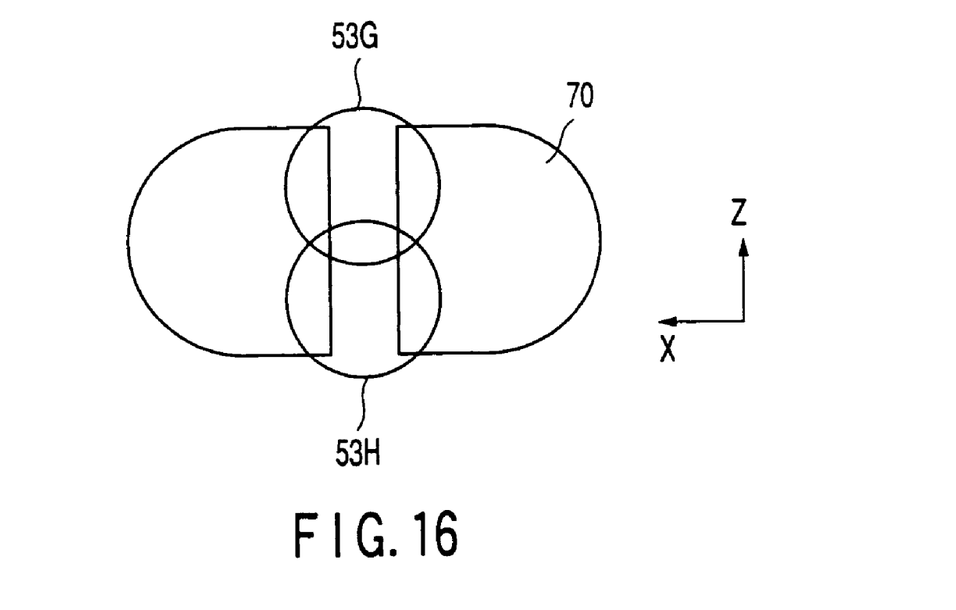
FIG. 16 is a view showing another example of the upper unit 140 used for chest imaging.

The shape of each surface coil element is not limited to a circular shape. For example, as shown in FIG. 16, a looped coil element 70 having another shape may be used (e.g., in conjunction with circular coil elements 53G and 53H).

In addition, the respective embodiments may be practiced upon being properly combined as much as possible. In this case, an effect corresponding to the combination can be obtained. The above embodiment includes inventions of various stages, and various inventions can be extracted by proper combinations of a plurality of disclosed constituent elements. When, for example, the problem described in "BACKGROUND OF THE INVENTION" can be solved and at least one of the effects described in "BRIEF SUMMARY OF THE INVENTION" can be obtained even if several constituent elements are omitted from the all the constituent elements in each embodiment, the arrangement from which these constituent elements are omitted can be extracted as an invention.

As has been described above, according to this embodiment, there is provided a magnetic resonance imaging apparatus which can freely apply the PI method to a slice in an arbitrary direction in the imaging method using a plurality of surface coils, thereby obtaining a magnetic resonance image with a high S/N ratio or at high speed, and an RF coil used in the apparatus.

What is claimed is:

1. An RF coil unit used in a magnetic resonance imaging apparatus which receives magnetic resonance signals generated from a common imaged volume of an object to be examined which is placed in a static magnetic field and generates a magnetic resonance image, said RF coil unit comprising:

a first unit including a plurality of surface coils which are arrayed, with at least two of said plurality of surface coils disposed along each of a first direction and a second direction perpendicular to the first direction;

a second unit which is spaced apart from and arranged symmetrically opposite to the first unit in said third direction which is perpendicular to both of the first and second directions, said second unit also including a plurality of at least two surface coils arranged in each of the first and second directions defined by the first unit whereby there are at least two surface coils of the first unit and the second unit located in each of the first, second, and third directions, that each receive magnetic resonance signals from the common imaged volume of the object to be examined; and a strap configured to fasten said first unit and said second unit of the RF coil unit together about the object to be examined.

2. An RF coil as in claim 1 wherein the first unit includes a mark for positioning it with respect to the second unit.

3. An RF coil unit as in claim 1 wherein the first unit includes grooves for positioning it with respect to the second unit.

4. An RF coil unit as in claim 1 wherein the first and second units are used for imaging a thoracicoabdominal region of a patient.

5. An RF coil unit as in claim 1 further comprising a second cable configured to transmit the magnetic resonance signals transmitted by said first transmit unit and the magnetic resonance signals received by said surface coils of said second unit to outside of the RF coil.

6. An RF coil unit as in claim 1 further comprising a fixing device that fixes said plurality of surface coils with respect to the object.

7. An RF coil unit as in claim 1 further comprising an alignment portion configured to serve as a reference for alignment of respectively corresponding surface coils in one group with respect to another group.

8. An RF coil unit as in claim 1 further comprising a shape maintaining portion configured to maintain at least some of said plurality of surface coils in a predetermined shape.

9. An RF coil unit as in claim 1 wherein at least one of said plurality of surface coils is a QD coil which detects substantially orthogonal magnetic resonance signals.

10. An RF coil unit as in claim 1 wherein said QD coil includes a looped coil element and an 8-shaped coil element.

11. An RF coil unit as in claim 1 wherein said QD coil has a plurality of 8-shaped coil elements which are overlapped so as to be orthogonal to each other.

12. An RF coil unit as in claim 1 wherein each of said surface coils includes a looped coil element which detect substantially orthogonal magnetic resonance signals;
    said looped coil element being partly overlapped on another looped coil element of an adjacent surface coil in at least one of three directions; and
    said 8-shaped coil element being partly overlapped on another 8-shaped coil element of an adjacent surface coil in at least one of the three directions.

13. An RF coil unit as in claim 1 wherein
    each of said surface coils has two 8-shaped coil elements which detect substantially orthogonal magnetic resonance signals, and
    said plurality of 8-shaped coil elements are arrayed in at least one of the three directions such that 8-shaped coil elements of adjacent surface coils are partly overlapped.

14. An RF coil unit as in claim 1 wherein at least one of said plurality of surface coils is removably connected to the others.

15. An RF coil unit used in a magnetic resonance imaging apparatus which receives magnetic resonance signals generated from a common imaged volume of an object to be examined which is placed in a static magnetic field and generates a magnetic resonance image, said RF coil unit comprising:
    a first unit including a plurality of surface coils which are arrayed, with at least two of said surface coils disposed along each of a first direction and a second direction perpendicular to the first direction;
    a second unit which is spaced apart from and arranged symmetrically opposite to the first unit in a third direction which is perpendicular to both of the first and second directions, said second unit also including a plurality of at least two surface coils arranged in each of the first direction and the second direction whereby there are at least two surface coils of the first unit and the second unit located in each of the first, second, and third directions, that each receive magnetic resonance signals from the common imaged volume of the object to be examined,
    a first cable configured to transmit the magnetic resonance signals received by said surface coils of said first unit to said second unit; and
    a plurality of second cables electrically connecting those surface coils which are disposed to oppose each other, or are adjacent to each other in such a way to acquire magnetic resonance signals having substantially the same phase.

16. An RF coil unit as in claim 15 wherein the first unit includes a mark for positioning it with respect to the second unit.

17. An RF coil unit as in claim 15 wherein the first unit includes grooves for positioning it with respect to the second unit.

18. An RF coil unit as in claim 15 wherein the first and second units are used for imaging a thoracicoabdominal region of a patient.

19. An RF coil unit as in claim 15 further comprising a third cable configured to transmit the magnetic resonance signals transmitted by said first transmit unit and the magnetic resonance signals received by each said coil included by said second unit itself to said magnetic resonance image apparatus.

20. An RF coil unit as in claim 15 wherein
    each of said plurality of surface coils includes a looped coil element and an 8-shaped coil element which detect substantially orthogonal magnetic resonance signals, and
    the plurality of said second cables which electrically connect said looped coil elements to ground to make at least one of said looped coil elements which oppose each other and said looped coil elements which are adjacent to each other acquire magnetic resonance signals having substantially the same phase.

21. An RF coil unit as in claim 15 wherein
    each of said second plurality of surface coils has a looped coil element and an 8-shape coil element which detect substantially orthogonal magnetic resonance signals, and
    the plurality of said cables which electrically connect said 8-shaped coil elements to the ground to make at least one of said 8-shaped coil elements which oppose each other and said 8-shaped coil elements which are adjacent to each other acquire magnetic resonance signals having substantially the same phase.

22. An RF coil unit as in claim 15 wherein
    each of said plurality of surface coils has two 8-shaped coil elements which detect substantially orthogonal magnetic resonance signals, and
    the plurality of said second cables which electrically connect said 8-shaped coil elements to ground to made at least one of said 8-shaped coil elements which oppose each other and said 8-shaped coils which are adjacent to each other acquire magnetic resonance signals having substantially the same phase.

23. An RF coil unit as in claim 15 wherein at least one of said plurality of surface coil is replaceable removably connected to the others.

24. A magnetic resonance imaging apparatus which receives magnetic resonance signals generated from a common imaged volume of an object to be examined which is placed in a static magnetic field and generates a magnetic resonance image, said apparatus comprising:
    a first unit including a plurality of RF surface coils which are arrayed, with at least two of said surface coils disposed along each of a first direction and a second direction perpendicular to the first direction;
    a second unit which is spaced apart from and arranged symmetrically opposite to the first unit in a third direction which is perpendicular to both of the first and second directions, said second unit also including a plurality of at least two RF surface coils arranged in each of the first direction and the second direction whereby there are at least two surface coils of the first unit and the second unit located in each of the first, second, and third directions, that each receive magnetic resonance signals from the common imaged volume of the object to be examined; and a strap configured to fasten said first unit and said second unit of the RF surface coils together about the object to be examined;

a receiver which receives the magnetic resonance signals from said first and second units; and an image-generating unit configured to generate a magnetic resonance image utilizing magnetic resonance signals received by said receiver.

25. A magnetic resonance imaging apparatus as in claim 24 wherein the first unit includes a mark for positioning it with respect to the second unit.

26. A magnetic resonance imaging apparatus as in claim 24 wherein the first unit includes grooves for positioning it with respect to the second unit.

27. A magnetic resonance imaging apparatus as in claim 24 wherein the first and second units are used for imaging a thoracicoabdominal region of a patient.

* * * * *

UNITED STATES PATENT AND TRADEMARK OFFICE
CERTIFICATE OF CORRECTION

| | | |
|---|---|---|
| PATENT NO. | : 7,109,713 B2 | Page 1 of 1 |
| APPLICATION NO. | : 11/180713 | |
| DATED | : September 19, 2006 | |
| INVENTOR(S) | : Okamoto et al. | |

It is certified that error appears in the above-identified patent and that said Letters Patent is hereby corrected as shown below:

Please correct Front Page of Patent, Notice Section as shown below:
Title page
Insert "(*) Notice"

--This patent is subject to a terminal disclaimer.--

Signed and Sealed this

Second Day of January, 2007

JON W. DUDAS
*Director of the United States Patent and Trademark Office*